United States Patent [19]
Abel et al.

[11] Patent Number: 4,812,742
[45] Date of Patent: Mar. 14, 1989

[54] INTEGRATED CIRCUIT PACKAGE HAVING A REMOVABLE TEST REGION FOR TESTING FOR SHORTS AND OPENS

[75] Inventors: Kenneth N. Abel, Vista; John E. Rudy, Poway, both of Calif.

[73] Assignee: Unisys Corporation, Blue Bell, Pa.

[21] Appl. No.: 127,972

[22] Filed: Dec. 3, 1987

[51] Int. Cl.[4] .......................................... G01R 31/02
[52] U.S. Cl. .................................. 324/73 R; 324/538
[58] Field of Search ............. 324/73 R, 73 PC, 158 F, 324/537, 538, 158 R; 437/8

[56] References Cited

U.S. PATENT DOCUMENTS

| | | | |
|---|---|---|---|
| 3,746,973 | 7/1973 | McMahon, Jr. | 324/158 F |
| 3,808,532 | 4/1974 | Yuska | 324/158 F |
| 3,953,797 | 4/1976 | Berard et al. | 324/158 F |

FOREIGN PATENT DOCUMENTS

| | | | |
|---|---|---|---|
| 2633175 | 7/1976 | Fed. Rep. of Germany | 324/73 PC |
| 2260257 | 8/1975 | France | 324/73 PC |
| 0001574 | 1/1985 | Japan | 324/73 PC |

*Primary Examiner*—Ernest F. Karlsen
*Attorney, Agent, or Firm*—Charles J. Fassbender; Kenneth L. Miller

[57] ABSTRACT

This invention is an improvement to an integrated circuit package which is of a type that includes a package body with multiple chip attach regions for holding respective integrated circuit chips, signal pads around the chip attach regions, an array of I/O pins on the package body, a first set of conductors in the package body which selectively connect some of the signal pads to the I/O pins, and a second set of conductors which selectively connect some of the signal pads to each other but not to any I/O pins. This improvement enhances the testability of the package at its intermediate state of manufacture, and it comprises: (a) a test region in the package body which is spaced apart from the I/O pins, the chip attach regions, the signal pads, and the first and second sets of conductors; (b) an array of test pins which is attached to the test region of the package body; and (c) a third set of conductors which are disposed in the package body that selectively connect the I/O pins to the signal pads and the first and second sets of conductors such that all conductive paths can be tested for shorts and/or opens via the test pins and the I/O pins. Then, after testing is complete, the test region of the package body is permanently removed from the remainder of the package by a step such as sawing.

10 Claims, 2 Drawing Sheets

INTEGRATED CIRCUIT PACKAGE HAVING A REMOVABLE TEST REGION FOR TESTING FOR SHORTS AND OPENS

BACKGROUND OF THE INVENTION

This invention relates to architectures for integrated circuit packages which enhance the packages' testability, and it relates to methods of testing such packages for electrical shorts and open circuits.

Typically, an integrated circuit package is comprised of several thin flat layers of ceramic which are laminated together to form the body of the package. One or more integrated circuit chips are epoxied to the package body at respective chip attach regions. Electrical signals are sent between the chips and signal pads on the package via discrete bonding wires; and from there, signals are sent to I/O pins (input/output pins) via a set of conductors which are routed internal to the package body.

To avoid wasting good chips in a defective package, the conductive paths between the input/output pins and the signal pads are usually tested for shorts and opens before the integrated circuit chips are epoxied to the package. In the prior art, this test is performed by placing the input/output pins of the package in a socket; and by simultaneously contacting all of the signal pads with respective probes through what is called a "bed of needles". One such bed of needles is sold, for example, by CerProbe Corporation of Tempe, Ariz.

During this test, electrical signals are sent from the I/O pins through the package conductors to the signal pads and through the bed of needles. Also, in those integrated circuit packages which hold multiple chips, some of the signal pads are often connected together via another set of conductors in the package without going to any I/O pin; and such package conductors are tested by sending electrical signals through them and their signal pads via two different probes in the bed of needles.

However, one problem with the above described testing method is that misalignment can occur between the bed of needles and the signal pads; and that in turn will cause an erroneous test. Such misalignment occurs because the signal pads are quite small (e.g., four mils with four mils spacing), and because various manufacturing tolerances occur in the package and the bed of needles. For example, a ceramic package has a certain amount of shrinkage (typically ±10 mils per inch); a ceramic package also has a certain amount of non-flatness (typically ±4 mils per inch); and the location of the probes on the bed of needles has a certain amount of of misregistration (typically ±2 mils per inch).

Also, damage can occur to the signal pads when they are contacted by the bed of needles. For example, the signal pads can be scratched, and that in turn will reduce the package's reliability. Further, the bed of needles and its associated fixturing is quite expensive. Typically, just one bed of needles costs about $10,000; its fixturing costs about $50,000; and a different bed of needles is needed for each different type of package since its probes must coincide with the signal pads on the package.

Accordingly, a primary object of the invention is to provide a new and improved integrated circuit package in which all of the above problems are overcome.

BRIEF SUMMARY OF THE INVENTION

With this invention, an improvement is made to an integrated circuit package which is of a type that includes a package body with multiple chip attach regions for holding respective integrated circuit chips, signal pads around the chip attach regions, an array of I/O pins on the package body, a first set of conductors in the package body which selectively connect some of the signal pads to the array of I/O pins, and a second set of conductors in the package body which selectively connect some of the signal pads to each other but not to any of the I/O pins. This improvement enhances the testability of the package at its intermediate state of manufacture, and it comprises: (a) a test region in the package body which is spaced apart from the array of I/O pins, the chip attach regions, the signal pads, and the first and second sets of conductors; (b) an array of test pins which is attached to the test region of the package body; and (c) a third set of conductors which are disposed in the test region that selectively connect the test pins to the signal pads and the first and second sets of conductors such that all conductive paths can be tested for shorts and/or opens via the test pins and the I/O pins. Then, after testing is complete, the test region of the package body is permanently removed from the remainder of the package by a step such as sawing through the package body and the third set of conductors.

BRIEF DESCRIPTION OF THE DRAWINGS

Various features and advantages of the invention are described herein in conjunction with the accompanying drawings wherein.

DETAILED DESCRIPTION OF THE INVENTION

Figure 1:
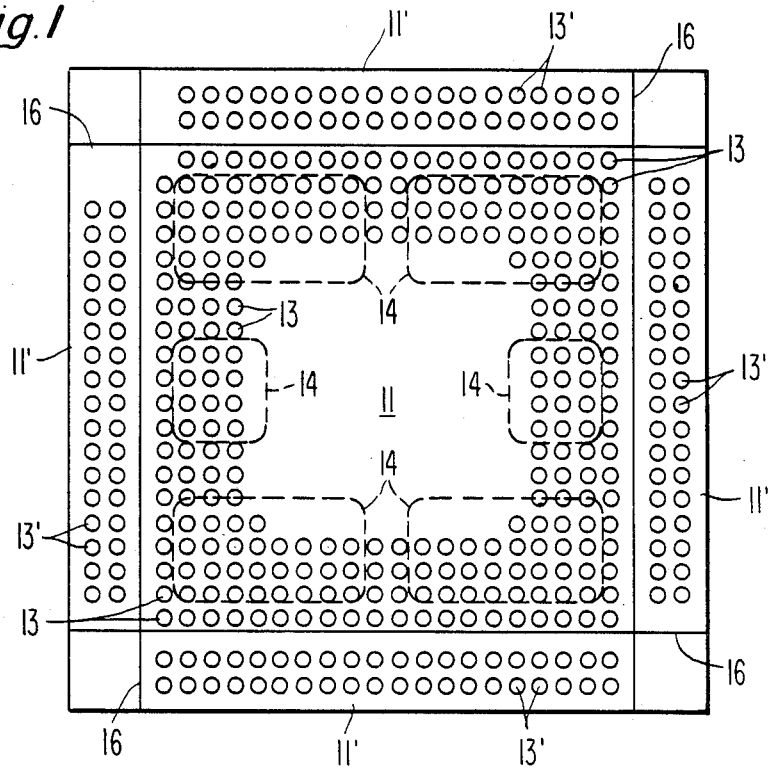
FIG. 1 shows the bottom surface of an integrated circuit package, at an intermediate stage of manufacture, which is constructed according to the invention.

Referring now to the figures, a preferred embodiment of an integrated circuit package which is constructed according to the invention will be described in detail. In all of the figures, reference numeral 11 indicates a central portion of the body of the package; and reference numeral 11' indicates a test portion of the body of the package. Also, reference numeral 12 indicates several chip attach regions on the central portion 11 of the package body for holding respective integrated circuit chips (which are not yet attached to the regions 12); reference numeral 13 indicates an array of I/O pins which are attached to the central body portion 11; and reference numeral 13' indicates an array of test pins on the test body portion 11'.

Several thin flat layers of ceramic or epoxy-glass (e.g., 3 to 20 layers) which are laminated together make up the central portion 11 of the package body and the test portion 11'. All of the I/O pins 13 and test pins 13' are attached to a bottom surface of these laminated layers. Cavities 14 extend from a top surface of these layers into the underlying layers, and the chip attach regions 12 lie in these cavities.

Disposed around each of the chip attach regions 12 are multiple signal pads 15. For clarity, just a few of these signal pads are shown. Electrical connections are selectively made between the pads 15 and the I/O pins 13 by one set of patterned conductors "a". Electrical connections are also made between the pads themselves but none of the I/O pins 13 by another set of patterned conductors "b", and "c". All of the conductors lie on the various laminated layers of the package body, and they pass from layer to layer through small metal filled via holes. From the signal pads, connections are made to the integrated circuit chips by discrete bonding wires (which are bonded after the chips are attached) or by TAB leads on the chips themselves.

Now with this package architecture, the central portion 11 contains all of the electrically conductive items which are needed to send signals to and from the integrated circuit chips during their normal operation. Those items consist of all of the chip attach regions 12, all of the signal pads 15, all of the I/O pins 13, and all of the conductors a, b, and c.

By comparison, the test portion 11' of the package is not even needed for the operation of IC chips. Its function is to enable tests to be made for continuity and shorts on the conductors a, b, and c without the use of any bed of needles. These tests are performed via the test pins 13' and another set of patterned conductors a', b', and c'.

Figure 2:
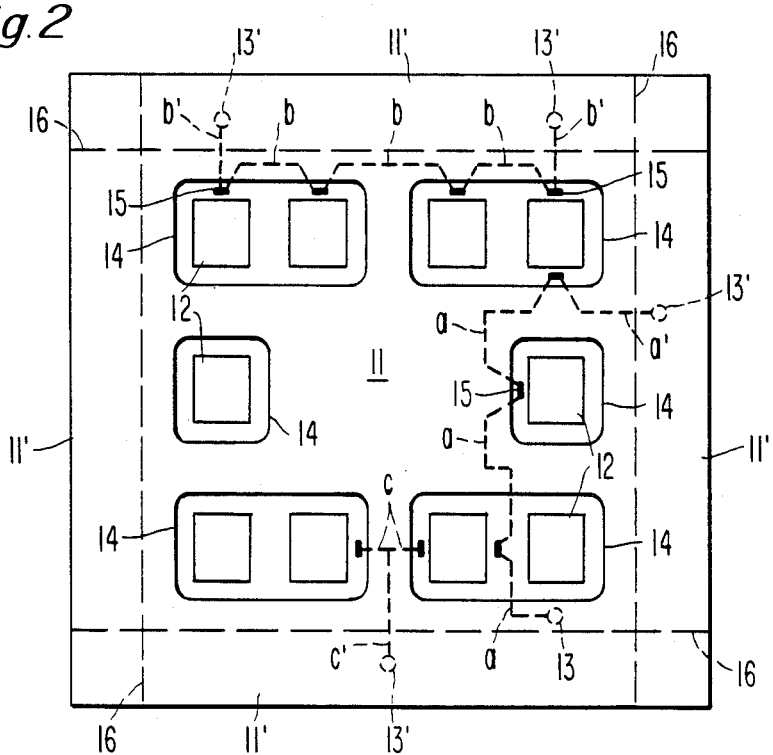
FIG. 2 shows the top surface of the integrated circuit package of FIG. 1.

In FIG. 2, the conductors labeled "a" indicate a signal path which is needed between several of the signal pads 15 and one of the I/O pins 13 in order to operate the IC chips. This signal path would be testable for shorts via its one I/O pin 13, but it would not be testable for continuity. So to avoid this problem, the a' conductor is connected from a test pin 13' to the end of the "a" conductors.

Also in FIG. 2, the conductors labeled "b" indicate a signal path which is needed between several of the signal pads 15 to operate the IC chips; and that signal path is not testable either for shorts or continuity through any of the I/O pins 13. So to avoid that testability problem, the b' conductors are connected from both ends of "b" conductors to respective test pins 13' in the test region.

Further in FIG. 2, the conductor labeled "c" indicates a signal path which is needed between two of the signal pads 15 to operate the IC chips. This signal path is not testable for shorts or continuity via the I/O pins 13. So that path is connected to one test pin 13' in the test region via the c' conductor to make it at least testable for shorts.

Thus with the above described integrated circuit package, all of the testing problems which were pointed out in the Background portion of this application are overcome. Specifically, a bed of needles is not needed to test for shorts and opens, and that in turn eliminates: (a) the cost of a bed of needles testing apparatus, (b) the problem of aligning the bed of needles to the signal pads, and (c) any damage to the signal pads which is caused by contact with the bed of needles.

Figure 3:
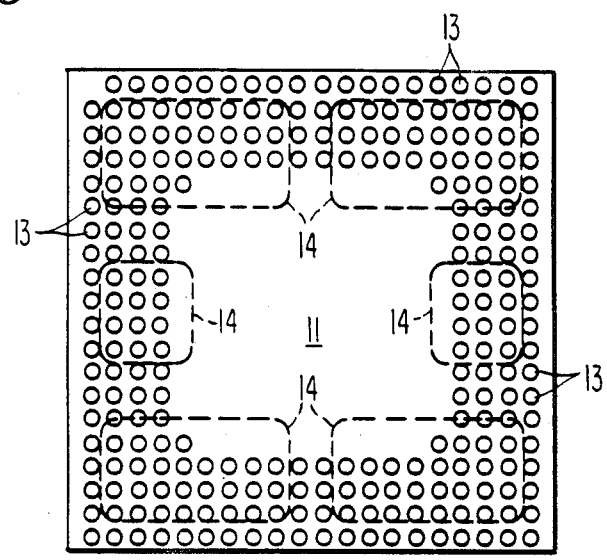
FIG. 3 shows the bottom surface of the integrated circuit package of FIG. 1 after that package has been tested for shorts and opens and after the test portion of the package has been removed.
Figure 4:
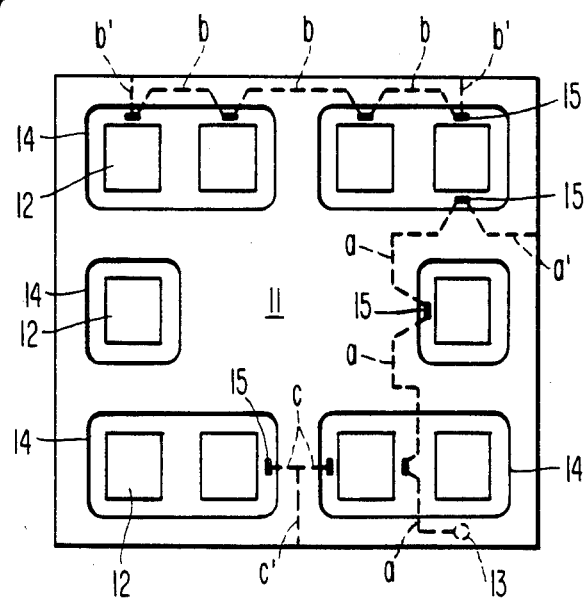
FIG. 4 shows the top surface of the integrated circuit package of FIG. 3.

On the other hand, providing a test region 11' on the disclosed integrated circuit package does substantially increase the package's area. Therefore, after the package is tested for shorts and opens via the I/O pins 13 and the test pins 13', the test portion 11' of the package is permanently separated from the central portion 11. This increases the number of packages which can be mounted in a given space as a printed circuit board; and it can be performed by scribing lines 16 around the test region and breaking off the test region along the scribed lines. FIGS. 3 and 4 show the results of this separation step.

A preferred embodiment of the invention has now been described in detail. In addition, however, many changes and modifications can be made to these details without departing from the nature and spirit of the invention. For example, the test region 11' can be separated from the central region 11 by sawing along the lines 16 or cutting there with a laser beam. Accordingly, the invention is not to be limited to the above details but is defined by the appended claims.

What is claimed is:

1. An improved integrated circuit package, at an intermediate stage of manufacturing, of a type which includes a package body that has multiple chip attach regions for holding respective integrated circuit chips, signal pads at said chip attach regions, an array of I/O pins on said package body, a first set of conductors in said package body which selectively connect said I/O pins to some of said signal pads, and a second set of conductors in said package body which selectively connect some of said signal pads to each other but not to any of said I/O pins; wherein the improvement enhances the testability of said package and comprises:

a test region in said package body which is spaced apart and severable from said I/O pins, said chip attach regions, said signal pads, and said first and second sets of conductors;

an array of test pins attached to said test region of said package body; and a severable test set of conductors disposed in said package body which selectively connect said test pins to said signal pads such that said conductors of said first and second sets are connected in completed circuits between said I/O pins and said test pins.

2. An integrated circuit package according to claim 1 wherein at least some of said signal pads are interconnected in series between two of said test pins.

3. An integrated circuit package according to claim 1 wherein at least some of said signal pads are interconnected in series between one of said I/O pins and one of said test pins.

4. An integrated circuit package according to claim 1 wherein at least some of said signal pads are interconnected to a single test pin but no I/O pins.

5. An integrated circuit package according to claim 1 wherein said package body has a scribe line which separates said I/O pins from said test pins.

6. An integrated circuit package according to claim 1 wherein said package body is comprised of laminated layers of ceramic.

7. An integrated circuit package according to claim 1 wherein said package body is comprised of laminated layers of epoxy glass.

8. An integrated circuit package according to claim 1 wherein said signal pads are for being bonded to discrete wires from said chips.

9. An integrated circuit package according to claim 1 wherein said signal pads are for being bonded to TAB leads from said chips.

10. An improved integrated circuit package, at an intermediate stage of manufacturing, of a type which includes a package body that has at least one chip attach region for holding an integrated circuit chip, signal pads at each chip attach region, an array of I/O pins on said package body, and a first set of conductors in said package body which selectively connect said I/O pins to some of said signal pads and terminate on particular signal pads; wherein the improvement enhances the testability of said package and comprises:

a test region in said package body which is spaced apart and severable from said I/O pins, said chip attach region, said signal pads, and said first set of conductors;

an array of test pins attached to said test region of said package body; and a severable test set of conductors disposed in said package body which selectively connect said test pins to said particular signal pads and form complete circuits with said conductors of said first set being connected between said I/O pins and said test pins.

* * * * *